United States Patent
Wu (10) Patent No.: US 11,553,599 B2
(45) Date of Patent: Jan. 10, 2023

(54) COMPONENT CARRIER COMPRISING PILLARS ON A CORELESS SUBSTRATE

(71) Applicant: AT&S (Chongqing) Company Limited, Chongqing (CN)

(72) Inventor: Yu-Hui Wu, Taoyuan (TW)

(73) Assignee: AT&S(Chongqing) Company Limited, Chongqing (CN)

( * ) Notice: Subject to any disclaimer, the term of this patent is extended or adjusted under 35 U.S.C. 154(b) by 10 days.

(21) Appl. No.: 16/713,527

(22) Filed: Dec. 13, 2019

(65) Prior Publication Data

US 2020/0205300 A1 Jun. 25, 2020

(30) Foreign Application Priority Data

Dec. 24, 2018 (CN) .......................... 20181158190537

(51) Int. Cl.
| | |
|---|---|
| H05K 1/09 | (2006.01) |
| H05K 1/11 | (2006.01) |
| H05K 3/06 | (2006.01) |
| H05K 3/10 | (2006.01) |
| H05K 3/24 | (2006.01) |
| H05K 3/36 | (2006.01) |
| H05K 3/40 | (2006.01) |
| H01L 21/02 | (2006.01) |
| H01L 21/28 | (2006.01) |

(Continued)

(52) U.S. Cl.
CPC ........... *H05K 3/4007* (2013.01); *H05K 1/111* (2013.01); *H05K 1/144* (2013.01); *H05K 3/24* (2013.01); *H05K 3/465* (2013.01); *H05K 3/4682* (2013.01)

(58) Field of Classification Search
CPC ... H05K 1/09; H05K 1/11; H05K 3/06; H05K 3/10; H05K 3/24; H05K 3/36; H05K 3/40

USPC ........ 361/764, 760; 174/256–258, 261, 262; 257/621, 666, 668, 685, 686, 688, 737, 257/738, 750, 755, 762, 774, 778, 780; 438/123, 597, 614, 622, 652

See application file for complete search history.

(56) References Cited

U.S. PATENT DOCUMENTS

| | | | | | |
|---|---|---|---|---|---|
| 4,229,637 | A | * | 10/1980 | Dederer | ................. B23K 11/31 |
| | | | | | 219/86.25 |
| 5,587,337 | A | * | 12/1996 | Idaka | ................. H01L 21/31058 |
| | | | | | 438/613 |

(Continued)

FOREIGN PATENT DOCUMENTS

| | | |
|---|---|---|
| CN | 101076883 A | 11/2007 |
| CN | 103887276 A | 6/2014 |
| JP | 2000340712 A | 12/2000 |

OTHER PUBLICATIONS

The Chinese National Intellectual Property Administration of the Peoples republic of China; Office Action in Patent Application 201811581905.7, dated Dec. 23, 2019, pp. 1-6.

*Primary Examiner* — Xiaoliang Chen
(74) *Attorney, Agent, or Firm* — Robert A. Blaha; Smith Tempel Blaha LLC (57) ABSTRACT

A component carrier includes a stack with an electrically conductive layer structure and an electrically insulating layer structure. The electrically conductive layer structure having a first plating structure and a pillar. The pillar has a seed layer portion on the first plating structure and a second plating structure on the seed layer portion. A method of manufacturing such a component carrier and an arrangement including such a component carrier are also disclosed.

18 Claims, 4 Drawing Sheets

(51) Int. Cl.
  *H01L 21/44* (2006.01)
  *H01L 21/48* (2006.01)
  *H01L 21/50* (2006.01)
  *H01L 21/56* (2006.01)
  *H01L 21/58* (2006.01)
  *H01L 21/60* (2006.01)
  *H01L 21/78* (2006.01)
  *H01L 21/98* (2006.01)
  *H01L 21/768* (2006.01)
  *H01L 23/00* (2006.01)
  *H01L 23/06* (2006.01)
  *H01L 23/10* (2006.01)
  *H01L 23/31* (2006.01)
  *H01L 23/34* (2006.01)
  *H01L 23/36* (2006.01)
  *H01L 23/50* (2006.01)
  *H01L 23/52* (2006.01)
  *H01L 23/488* (2006.01)
  *H01L 23/498* (2006.01)
  *H01L 23/528* (2006.01)
  *H01L 23/532* (2006.01)
  *H01L 23/538* (2006.01)
  *H05K 3/46* (2006.01)
  *H05K 1/14* (2006.01)

(56) References Cited

U.S. PATENT DOCUMENTS

| | | | | |
|---|---|---|---|---|
| 6,097,097 A * | 8/2000 | Hirose | H01L 23/5386 | 257/778 |
| 6,194,781 B1 * | 2/2001 | Ikegami | H01L 24/16 | 257/737 |
| 6,248,655 B1 * | 6/2001 | Machida | G01B 7/004 | 438/597 |
| 6,717,262 B1 * | 4/2004 | Moriizumi | H01L 23/49811 | 257/737 |
| 7,190,080 B1 * | 3/2007 | Leu | H01L 21/568 | 257/690 |
| 8,492,891 B2 * | 7/2013 | Lu | H01L 24/11 | 257/737 |
| 8,759,949 B2 * | 6/2014 | Yu | H01L 23/481 | 257/621 |
| 9,147,661 B1 * | 9/2015 | Kwon | H01L 24/16 | |
| 9,484,291 B1 * | 11/2016 | Dhandapani | H01L 24/10 | |
| 9,918,378 B1 * | 3/2018 | Shimodaira | H01L 23/49838 | |
| 10,943,880 B2 * | 3/2021 | Shah | H01L 24/13 | |
| 2001/0004133 A1 * | 6/2001 | Ihara | H01L 23/3171 | 257/750 |
| 2001/0028105 A1 * | 10/2001 | Hashimoto | H01L 23/481 | 257/686 |
| 2002/0023895 A1 * | 2/2002 | Iida | H05K 3/4647 | 216/13 |
| 2003/0082846 A1 * | 5/2003 | Yoneda | H01L 25/0655 | 438/106 |
| 2003/0151140 A1 * | 8/2003 | Nishiyama | H01L 24/11 | 257/E21.511 |
| 2003/0155638 A1 * | 8/2003 | Ito | H05K 1/113 | 257/678 |
| 2004/0007779 A1 * | 1/2004 | Arbuthnot | H01L 24/03 | 257/780 |
| 2004/0134682 A1 * | 7/2004 | En | C25D 5/34 | 174/258 |
| 2004/0238926 A1 * | 12/2004 | Obinata | H01L 21/78 | 257/678 |
| 2004/0245621 A1 * | 12/2004 | Hanaoka | H01L 24/02 | 257/690 |
| 2005/0001324 A1 * | 1/2005 | Dunn | H01L 23/498 | 257/762 |
| 2005/0167830 A1 * | 8/2005 | Chang | H05K 3/4007 | 257/737 |
| 2006/0213428 A1 * | 9/2006 | Meguro | H01L 21/0262 | 117/84 |
| 2006/0263727 A1 * | 11/2006 | Lee | H01L 24/48 | 430/311 |
| 2007/0158104 A1 * | 7/2007 | Fujinami | H05K 3/108 | 174/261 |
| 2008/0251495 A1 * | 10/2008 | Cheng | H05K 3/4644 | 216/13 |
| 2009/0233436 A1 * | 9/2009 | Kim | H01L 24/81 | 438/614 |
| 2009/0242261 A1 * | 10/2009 | Takenaka | H05K 3/465 | 174/262 |
| 2009/0308651 A1 * | 12/2009 | Abe | H05K 3/445 | 174/264 |
| 2010/0025842 A1 * | 2/2010 | Yamamoto | H01L 24/12 | 257/692 |
| 2010/0109159 A1 * | 5/2010 | Ho | H01L 24/13 | 257/737 |
| 2010/0208437 A1 * | 8/2010 | Maeda | H01L 24/81 | 361/760 |
| 2010/0276787 A1 * | 11/2010 | Yu | H01L 25/50 | 257/621 |
| 2011/0003470 A1 * | 1/2011 | Burgess | H01L 24/11 | 438/614 |
| 2011/0162876 A1 * | 7/2011 | Arvin | C25D 5/12 | 174/257 |
| 2011/0193218 A1 * | 8/2011 | Arvin | H01L 23/49811 | 257/737 |
| 2011/0193227 A1 * | 8/2011 | Chuang | H01L 24/16 | 257/738 |
| 2011/0227219 A1 * | 9/2011 | Alvarado | H01L 24/05 | 257/738 |
| 2011/0233761 A1 * | 9/2011 | Hwang | H01L 24/13 | 257/737 |
| 2011/0266667 A1 * | 11/2011 | Wu | H01L 24/13 | 257/737 |
| 2011/0285011 A1 * | 11/2011 | Hwang | H01L 24/13 | 257/737 |
| 2011/0285023 A1 * | 11/2011 | Shen | H01L 24/09 | 257/773 |
| 2011/0317385 A1 * | 12/2011 | Zhou | H01L 24/03 | 361/771 |
| 2012/0012997 A1 * | 1/2012 | Shen | H01L 23/49816 | 257/737 |
| 2012/0074578 A1 * | 3/2012 | Kobayashi | H01L 24/13 | 257/773 |
| 2012/0193664 A1 * | 8/2012 | Lin | H01L 33/20 | 257/98 |
| 2012/0273935 A1 * | 11/2012 | Martens | H01L 24/81 | 257/737 |
| 2013/0017534 A1 * | 1/2013 | Nickel | C12Q 1/18 | 435/5 |
| 2013/0196499 A1 * | 8/2013 | Burgess | H01L 24/11 | 438/614 |
| 2013/0224952 A1 * | 8/2013 | Chang | H01L 29/7847 | 438/682 |
| 2013/0251948 A1 * | 9/2013 | Lyons | B08B 17/065 | 428/148 |
| 2014/0001645 A1 * | 1/2014 | Lin | H01L 23/3171 | 257/774 |
| 2014/0061920 A1 * | 3/2014 | Hirano | H01L 23/53238 | 257/751 |
| 2014/0252571 A1 * | 9/2014 | Khandekar | H01L 24/94 | 257/666 |
| 2014/0264829 A1 * | 9/2014 | Shahidi | H01L 21/4853 | 257/737 |
| 2015/0023858 A1 * | 1/2015 | Tour | C01B 32/184 | 423/276 |
| 2015/0041192 A1 * | 2/2015 | Han | H05K 3/108 | 174/268 |
| 2015/0076689 A1 * | 3/2015 | Huang | H01L 23/3192 | 257/737 |
| 2015/0097277 A1 * | 4/2015 | Chen | H01L 23/3135 | 257/668 |
| 2015/0137353 A1 * | 5/2015 | Wirz | H01L 24/94 | 257/737 |

(56) References Cited

U.S. PATENT DOCUMENTS

| | | | | |
|---|---|---|---|---|
| 2015/0162292 A1* | 6/2015 | Machida | H01L 24/11 | 257/737 |
| 2015/0192275 A1* | 7/2015 | Seo | G02B 19/0028 | 362/97.1 |
| 2015/0262878 A1* | 9/2015 | Sato | H01L 23/3135 | 257/777 |
| 2015/0279797 A1* | 10/2015 | Beck | H01L 24/11 | 257/737 |
| 2015/0305153 A1* | 10/2015 | Imafuji | H05K 3/4007 | 174/261 |
| 2015/0311170 A1* | 10/2015 | Arvin | H01L 24/13 | 438/614 |
| 2015/0364410 A1* | 12/2015 | Hando | H01L 23/49811 | 174/261 |
| 2015/0366058 A1* | 12/2015 | Hando | B23K 1/0008 | 174/261 |
| 2015/0371962 A1* | 12/2015 | Akamatsu | H01L 24/11 | 257/737 |
| 2015/0380371 A1* | 12/2015 | Chang | H01L 24/13 | 438/614 |
| 2016/0013099 A1* | 1/2016 | Tanida | H01L 24/08 | 257/622 |
| 2016/0021743 A1 | 1/2016 | Pai et al. | | |
| 2016/0118328 A1* | 4/2016 | Hu | H01L 21/6835 | 257/666 |
| 2016/0240503 A1* | 8/2016 | Shu | H01L 23/49816 | |
| 2016/0300808 A1* | 10/2016 | Kuo | H01L 24/11 | |
| 2016/0336298 A1* | 11/2016 | Tseng | H01L 23/3142 | |
| 2016/0351520 A1* | 12/2016 | Jiang | H01L 24/03 | |
| 2016/0356437 A1* | 12/2016 | Kim | F21V 5/10 | |
| 2016/0365327 A1 | 12/2016 | Shimodaira et al. | | |
| 2017/0062595 A1* | 3/2017 | Dungan | H01L 29/7371 | |
| 2017/0141059 A1* | 5/2017 | Shih | C25D 5/505 | |
| 2017/0194277 A1* | 7/2017 | Matsumodo | H01L 24/16 | |
| 2017/0265299 A1* | 9/2017 | Kitagawa | H05K 1/118 | |
| 2017/0345786 A1* | 11/2017 | Chen | H01L 24/83 | |
| 2018/0116057 A1* | 4/2018 | Kajihara | H01L 23/13 | |
| 2018/0119296 A1* | 5/2018 | Geioushy | C25B 3/25 | |
| 2018/0159459 A1* | 6/2018 | Mills | H02S 10/40 | |
| 2018/0218941 A1* | 8/2018 | Arai | H01L 23/53295 | |
| 2018/0218972 A1* | 8/2018 | Arai | H05K 1/112 | |
| 2018/0240743 A1* | 8/2018 | Lee | H01L 21/486 | |
| 2018/0286886 A1* | 10/2018 | Kimura | H01L 29/78696 | |
| 2018/0337038 A1* | 11/2018 | Chen | H01L 21/3212 | |
| 2019/0035753 A1* | 1/2019 | Shih | H01L 24/14 | |
| 2019/0109108 A1* | 4/2019 | Koduri | H01L 24/13 | |
| 2019/0148439 A1* | 5/2019 | Shin | H01L 27/142 | 257/443 |
| 2019/0214358 A1* | 7/2019 | Ha | H01L 24/11 | |
| 2020/0098621 A1* | 3/2020 | Bharath | H01L 25/0655 | |
| 2020/0105631 A9* | 4/2020 | Rusli | H01L 23/5226 | |
| 2020/0286847 A1* | 9/2020 | Liu | H01L 25/50 | |

\* cited by examiner

COMPONENT CARRIER COMPRISING PILLARS ON A CORELESS SUBSTRATE

CROSS-REFERENCE TO RELATED APPLICATION

This application claims the benefit of the filing date of the Chinese patent application no. 201811581905.7 filed on 24 Dec. 2018, which is incorporated herein by reference in its entirety.

TECHNICAL FIELD

Embodiments of the invention generally relate to a component carrier, a method of manufacturing the same and an arrangement comprising the component carrier.

TECHNOLOGICAL BACKGROUND

Ultra-thin substrates comprising pillars are recently demanded by customers. A robust and feasible process is very important for this kind of application.

SUMMARY

There is a need to provide a component carrier, a method of manufacturing the same and an arrangement comprising the component carrier, where the component carrier may be formed as an ultra-thin substrate.

This need may be met by a component carrier, a method of manufacturing the same and an arrangement comprising the component carrier according to the independent claims.

According to an exemplary embodiment of the invention, a component carrier is provided, wherein the component carrier comprises a stack including an electrically conductive layer structure and an electrically insulating layer structure; the electrically conductive layer structure having a first plating structure; and a pillar which includes a seed layer portion on the first plating structure and a second plating structure on the seed layer portion.

According to another exemplary embodiment of the invention, a method of manufacturing a component carrier includes the following steps: a) forming a stack having an electrically conductive layer structure and an electrically insulating layer structure; and b) forming the electrically conductive layer structure to have a first plating structure and a pillar which includes a seed layer portion on the first plating structure and a second plating structure on the seed layer portion.

According to an exemplary embodiment of the invention, an arrangement includes a component carrier as described above and another component carrier, wherein the pillar of the component carrier electrically contacts an electrically conductive layer structure of the other component carrier.

Advantageously, there is a short process flow and less investment costs for the pillar process in all embodiments. Furthermore, there is a robust connection for the pillar, and a flexible application for the coreless pillar technology is achieved.

OVERVIEW OF EMBODIMENTS

In the context of the present application, the term "pillar" is not only referred to pillar-shaped structures, but may also refer to a bump or a pad. An aspect ratio of a pillar, i.e. a ratio of the height to the diameter of the pillar, can preferably be in a range between 0.01 and 40, more preferred in a range between 0.4 and 2 and most preferred in a range between 0.4 and 1. For example, the pillars may have a diameter in a range of 5 to 200 μm and a height in a range of 2 to 200 μm.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers. A component carrier may also be used to interconnect several modules to each other. One module can be carried by two or more component carriers. For example, one and the same main surface of a module can be connected to or carried by two or more component carriers. A component carrier itself may also be a module which in turn is carried by or connected to one or more other component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming holes through the laminate, for instance by laser drilling or mechanical drilling, and by filling them with electrically conductive material (in particular copper), thereby forming vias as hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with glass material (such as glass fibers or glass spheres).

In the following, further exemplary embodiments of the component carrier, the arrangement, the method of manufacturing a component carrier will be explained.

In an embodiment of the component carrier, the seed layer portion is a foil portion; and the foil portion and the second plating structure of the pillar are preferably made of copper. The copper foil may have a thickness of about 0.5 to 5 µm in particular 1 to 3 and more particular 2 to 3 µm.

In an embodiment, the component carrier is a coreless component carrier where the stack is not supported on a core.

In an embodiment, the seed layer portion has an undercut with respect to the first plating structure and the second plating structure. The undercut may have a depth in a range between 0.3 µm and 5 µm.

In an embodiment, the first plating structure is arranged at least partially laterally inside of the electrically insulating layer structure.

In an embodiment, a surface finish either covers only a top surface of the pillar or a top surface and sidewalls of the pillar.

In a preferred embodiment, the surface finish comprises a single layer, in particular silver, Electroless Nickel Electroless Palladium Immersion Gold (ENEPIG), Electroless Nickel Immersion Gold (ENIG), Organic Solderability Preservatives (OSP), or more layers like a double layer, in particular nickel/gold, nickel/silver.

In an embodiment the pillar is tapered from the seed layer portion to the second plating structure.

In an embodiment, the electrically insulating layer structure surrounding the pillar has at least one concave surface portion.

In an embodiment, the stack is not provided with a solder resist on the side, where the pillar is arranged.

In an embodiment of the method described above, the first plating structure is arranged at least partially laterally inside of the electrically insulating layer structure.

In an embodiment, the step a) of the method described above comprises the following substeps: a1) Providing a temporary core having a core base covered by a seed layer, which forms an outer surface of the temporary core; a2) Forming the stack onto the seed layer of the temporary core; and a3) Separating the stack including the first plating structure and the seed layer from the core base of the temporary core; and wherein the step b) comprises the following substeps: b1) Applying a resist onto the seed layer; b2) Removing parts of the resist, for example by lithography or imaging and etching, thereby forming a pattern; b3) Plating the pattern, thereby forming the second plating structure of the pillar in accordance to the pattern; b4) Removing the remaining resist, if applicable after a step of tin plating; b5) Etching the seed layer to reduce a thickness of the seed layer at positions which are not covered by the pillar, thereby forming the seed layer portion; and b6) Providing a surface finish onto the pillar.

The seed layer is used for the pillar plating and for the only etching process. Additional metallization processes such as electroless plating and sputtering are not necessary. This achieves higher reliability in particular on a coreless seed layer.

In step b2) a DFR resist (Dry-Film-Resist) can be used.

In step b4), the remaining resist can be stripped by stripping chemistry, such as by exposure to one or more chemical compounds particularly by etching.

Because the seed layer is already provided in step a1), a separate step of forming a seed layer as in the prior art is not necessary in step b3).

In an embodiment in step b5) of the method described above, an undercut can be formed in the seed layer portion with respect to the first plating structure and the second plating structure. The undercut may have a depth in a range between 0.3 µm and 5 µm.

In step b6), the surface finish can be provided onto the pillar before or after the step b5) of etching the seed layer. If the surface finish is provided onto the pillar before the step of etching the seed layer, the following procedure is conceivable: First, a nickel layer and a subsequent gold layer can be applied or plated onto the pillar to form a surface finish. Thereafter, the etching step is conducted so that only a top surface of the pillar is or remains covered by the surface finish.

If the surface finish is provided onto the pillar after the step of etching the seed layer, the following procedure is conceivable: A surface finish of ENEPIG, ENIG or OSP is applied onto a top surface and sidewalls of the pillar.

In an embodiment, the seed layer is formed by a foil; and the foil and the second plating structure of the pillar are preferably made of copper.

In an embodiment the surface finish comprises a single layer, in particular silver, ENEPIG, ENIG, OSP, or a double layer, in particular nickel/gold, nickel/silver.

In an embodiment, the pillar is formed to taper from the seed layer to the second plating structure.

In an embodiment, the method further comprises a step c) of forming at least one concave surface portion in the electrically insulating layer structure surrounding the pillar.

In an embodiment of the arrangement, at least one of the component carrier and the other component carrier is a printed circuit board or a laminate-type component carrier.

In an embodiment of the arrangement, at a side of the other component carrier facing the component carrier, an electrically insulating layer structure is formed, in which a concavity is formed in correspondence to the other electrically conductive layer structure such that the other electrically conductive layer structure is exposed in the concavity of the other electrically insulating layer structure. Advantageously, a reliable and robust connection between both component carriers can be achieved.

In an embodiment, the component carrier further comprises a component, in particular an electronic component, mounted on and/or embedded in the at least one electrically insulating layer structure and/or the at least one electrically conductive layer structure.

In an embodiment, the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

In an embodiment, the at least one electrically conductive layer structure comprises at least one of the group consisting of copper, aluminum, nickel, silver, gold, palladium, and tungsten, any of the mentioned materials being optionally coated with supra-conductive material such as graphene.

In an embodiment, the at least one electrically insulating layer structure comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

In an embodiment, the component carrier is shaped as a plate.

In an embodiment, the component carrier is configured as one of the group consisting of a printed circuit board, and a substrate.

In an embodiment, the component carrier is configured as a laminate-type component carrier.

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment, a nano-coated structure may be used for component carrier technology, in particular as a dry-adhesive structure. An adhesive layer implementing such a surface configuration may also be denoted as gecko film. The adhesive effect of such a surface may be based on van der Waals forces. Descriptively speaking, a plurality of low dimensioned suction cups may be formed by such a concept. According to an exemplary embodiment of the invention, a reliable substrate and/or structured material is provided for embedding and/or surface mounting applications having specific adhesion properties due to a corresponding configuration of nano- and/or microstructures on this surface. Exemplary embodiments have the advantage that the mentioned adjustability of the surface adhesion properties may be obtained with low material consumption, low production costs, small contamination risk, and high process reliability.

In an embodiment, the mentioned materials may be used as support for component placement in embedding technologies. Compared to a traditional adhesive tape system that is depending on temperature and time, an exemplary embodiment uses the surface of a support (which may be rigid or flexible) or a PCB elements (such as cores, prepregs, copper foils, etc.), that exhibits, thanks to the nano- and/or microstructures, van der Waals attraction forces, a gecko effect, a high grip, and that is dry and thus can be cleaned and reused. A sheet with nano- and/or microstructures can also be included in the final product. When used for an embedding concept, components may be placed on the dry surface and can be held in position by weak bonds (like van der Waals forces, gecko effect, high grip values) prior to the component lamination.

Such an architecture allows to obtain a dry interaction between the component and the holding substrate. No additional liquid adhesive is required. This has the advantages of a dry interaction, and a reduction of risk of contamination from the substrate.

Figure 1:
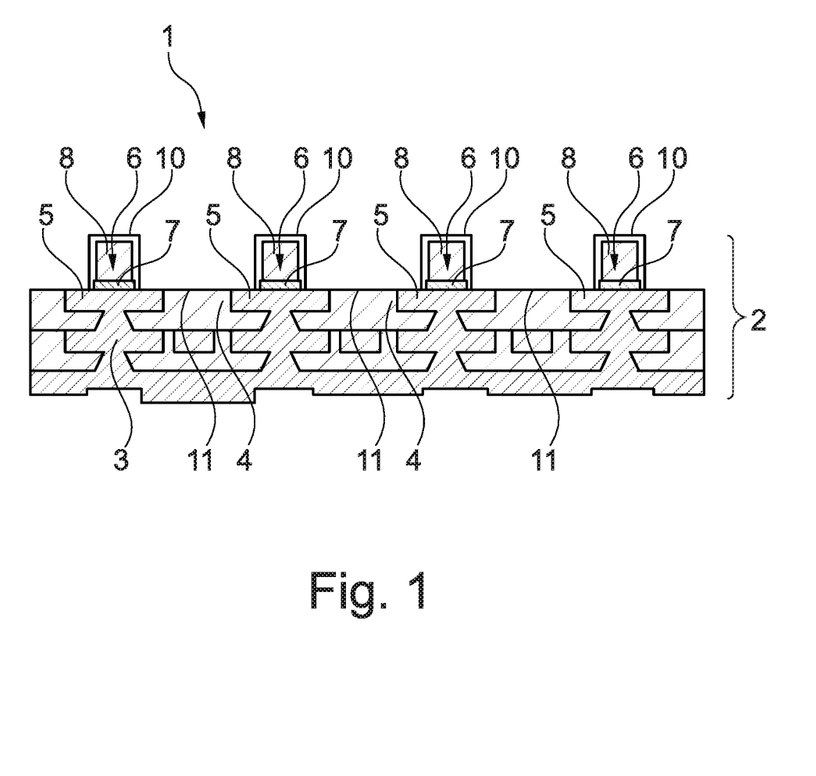
FIG. 1 illustrates a cross-sectional view of a component carrier according to an exemplary embodiment of the invention.

FIG. 1 illustrates a cross-sectional view of a component carrier 1 according to an exemplary embodiment of the invention.

The component carrier 1 comprises a stack 2 comprising an electrically conductive layer structure 3 and an electrically insulating layer structure 4. The electrically conductive layer structure 3 comprises a first plating structure 5 and a plurality of pillars 6. Each pillar 6 comprises a seed layer portion 7 on the first plating structure 5 and a second plating structure 8 on the seed layer portion 7. The pillars 6 may have a diameter in a range of 5 to 200 µm and a height in a range of 2 to 200 µm. The electrically conductive layer structure 3 may have a thickness in a range of 0.5 to 30 µm, preferably a range of 1 to 5 µm.

The seed layer portion 7 is a foil portion made of copper. The copper foil may have a thickness in a range of 0.5 to 5 µm, more particularly in a range of 2 to 3 µm. The second plating structure 8 of the pillars 6 is likewise made of copper. However, both can be made of any other metal material.

The component carrier 1 is a coreless component carrier 1 where the stack 2 is not supported on a core.

The first plating structure 5 is arranged at least partially laterally inside of the electrically insulating layer structure 4.

A surface finish 10 covers a top surface and sidewalls of the pillars 6.

In another embodiment, a surface finish 10 covers only a top surface of the pillars 6.

In one embodiment, the surface finish 10 comprises a single layer, in particular silver, ENEPIG, ENIG, OSP. In another embodiment, the surface finish 10 comprises a double layer, in particular nickel/gold, nickel/silver.

The stack 2 is not provided with a solder resist on the side, where the pillar 6 is arranged.

The component carrier 1 may comprise a component, in particular an electronic component, mounted on and/or embedded in the at least one electrically insulating layer structure 4 and/or the at least one electrically conductive layer structure 3.

The component can be selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

The at least one electrically conductive layer structure 3 may comprise at least one of the group consisting of copper, aluminum, nickel, silver, gold, palladium, and tungsten, any of the mentioned materials being optionally coated with supra-conductive material such as graphene.

The at least one electrically insulating layer structure 4 may comprise at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

In the depicted embodiment, the component carrier 1 is shaped as a plate.

The component carrier 1 can be configured as one of the group consisting of a printed circuit board, and a substrate. The component carrier 1 can likewise be configured as a laminate-type component carrier.

Figure 2:
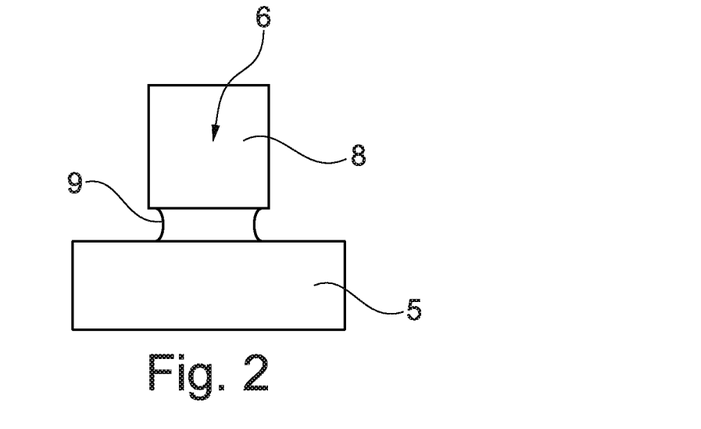
FIG. 2 illustrates a cross-sectional view of a component carrier around the pillar according to another exemplary embodiment of the invention.

FIG. 2 illustrates a cross-sectional view of a component carrier around the pillar 6 according to another exemplary embodiment of the invention. The seed layer portion 7 has an undercut 9 with respect to the first plating structure 5 and the second plating structure 8.

Figure 3:
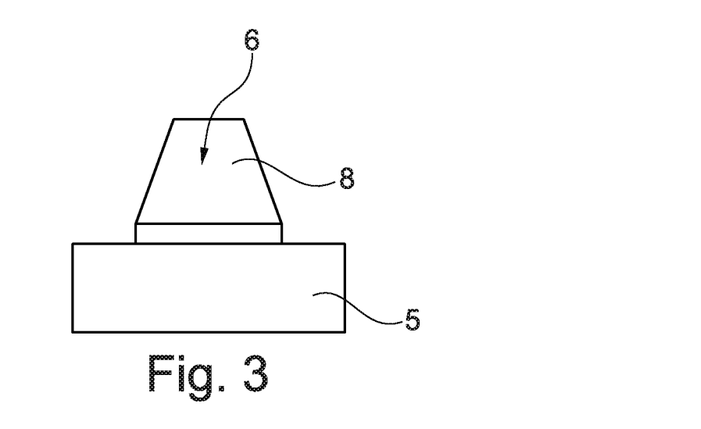
FIG. 3 illustrates a cross-sectional view of a component carrier around the pillar according to still another exemplary embodiment of the invention.

FIG. 3 illustrates a cross-sectional view of a component carrier around the pillar 6 according to still another exemplary embodiment of the invention. The pillar 6 is tapered from the seed layer portion 7 to the second plating structure 8.

Figure 4:
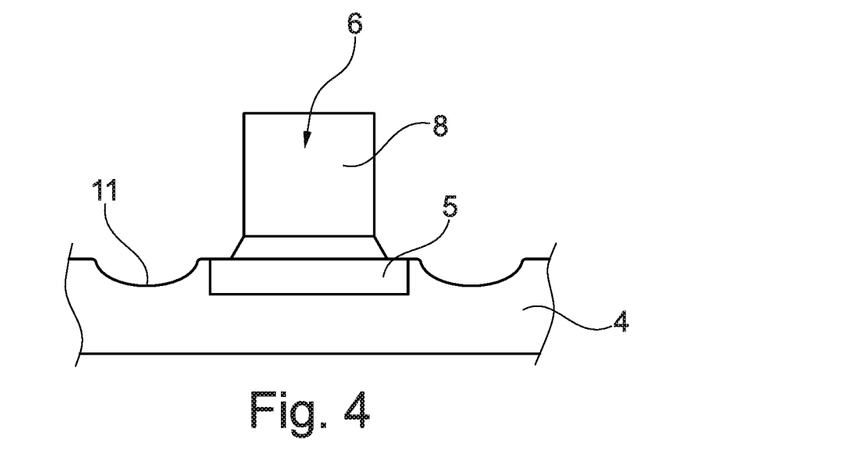
FIG. 4 illustrates a cross-sectional view of a component carrier around the pillar according to yet another exemplary embodiment of the invention.

FIG. 4 illustrates a cross-sectional view of a component carrier around the pillar 6 according to yet another exemplary embodiment of the invention. The electrically insulating layer structure 4 surrounding the pillar 6 has at least one concave surface portion 11.

Figure 5:
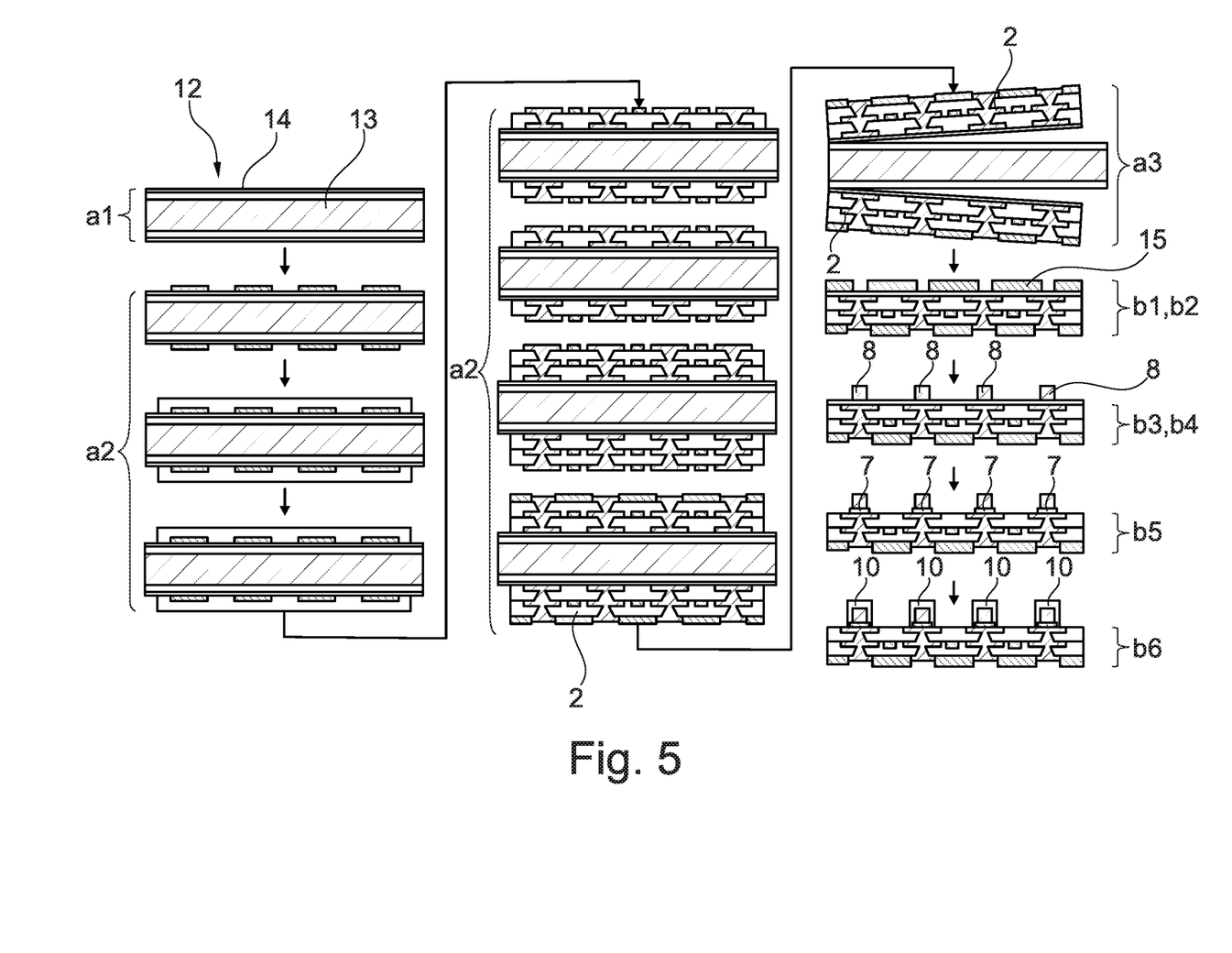
FIG. 5 illustrates cross-sectional views of the component carrier being presently under manufacture according to an exemplary embodiment of the invention.

FIG. 5 illustrates cross-sectional views of the component carrier 1 being presently under manufacture according to an exemplary embodiment of the invention. FIG. 5 thus describes a method of manufacturing the component carrier 1.

The method basically comprises a step a) of a forming a stack 2 comprising an electrically conductive layer structure 3 and an electrically insulating layer structure 4, and a step b) of forming the electrically conductive layer structure 3 to comprise a first plating structure 5 and a pillar 6 which comprises a seed layer portion 7 on the first plating structure 5 and a second plating structure 8 on the seed layer portion 7.

The electrically conductive layer structure 3 can be built-up by a dielectric material such as prepreg, epoxy-based build-up materials like epoxy-based build-up films as in a normal coreless process (ETS, Embedded-Trace-Substrate).

In the embodiment, the step a) comprises substeps a1) to a3) which are described later, and the step b) comprises substeps b1) to b6) which are described later in more detail.

In the method according to the embodiment, the step a) comprises the following substeps: a1) Providing a temporary core 12 having a core base 13 covered by a seed layer 14, which forms an outer surface of the temporary core 12; a2) Forming the stack 2 onto the seed layer 14 of the temporary core 12, wherein the first plating structure 5 can be arranged at least partially laterally inside of the electrically insulating layer structure 4, and a3) Separating the stack 2 including the first plating structure 5 and the seed layer 14 from the core base 13 of the temporary core 12. After having finished the last build-up layer, a solder resist can be applied, which is, however, not essential.

The step b) comprises the following substeps: b1) Applying a resist 15 onto the seed layer 14, for example a DFR resist (Dry-Film-Resist); b2) Removing parts of the resist 15, for example by lithography or imaging and etching, thereby forming a pattern; b3) Plating the pattern, thereby forming the second plating structure 8 of the pillar 6 in accordance to the pattern; b4) Removing the remaining resist 15 for example by etching, if applicable after a step of tin plating; b5) Etching the seed layer 14 to reduce a thickness of the seed layer 14 at positions which are not covered by the pillar 6, thereby forming the seed layer portion 7; and b6) Providing a surface finish 10 onto the pillar 6. In this method, only one etching process is necessary.

In an embodiment, step b6) can be conducted before step b5).

The method further comprises a step of covering a top surface and sidewalls of the pillar 6 by a surface finish 10. In another embodiment, only a top surface of the pillar 6 is covered by a surface finish 10. In one embodiment, the surface finish 10 comprises a single layer, in particular silver, ENEPIG, ENIG, OSP. In another embodiment, the surface finish 10 comprises a double layer, in particular nickel/gold, nickel/silver.

Depending on the etching speed and chemistry, usually by wet etching, different pillar shapes can be generated as shown in FIGS. 2 to 4.

In the embodiment of FIG. 2, an undercut 9 is formed in the seed layer portion 7 with respect to the first plating structure 5 and the second plating structure 8 in step b5). The undercut 9 may have a depth a range between 0.3 µm and 5 µm. The second plating structure 8 has a cylindrical shape with a substantial constant diameter. This shape can be achieved by fast etching, for example by using an aggressive etching chemistry such as $H_2O_2+H_2SO_4$+an additive.

The seed layer 14 is formed by a foil made of copper. The second plating structure 8 of the pillar 6 is likewise made of copper. However, both can be made of any other metal material.

In the embodiment of FIG. 3, the pillar 6 is formed to taper from the seed layer 14 to the second plating structure 8. This shape is achieved by slow etching, for example by using a less aggressive etching chemistry which can be adjusted by an additive.

In the embodiment of FIG. 4, the method further comprises a step c) of forming at least one dimple or concave surface portion 11 in the electrically insulating layer structure 4 surrounding the pillar 6. The concave surface portion 11 can be formed by over etching, a high etching spray pressure and/or a higher etching amount (longer processing time).

Figure 6:
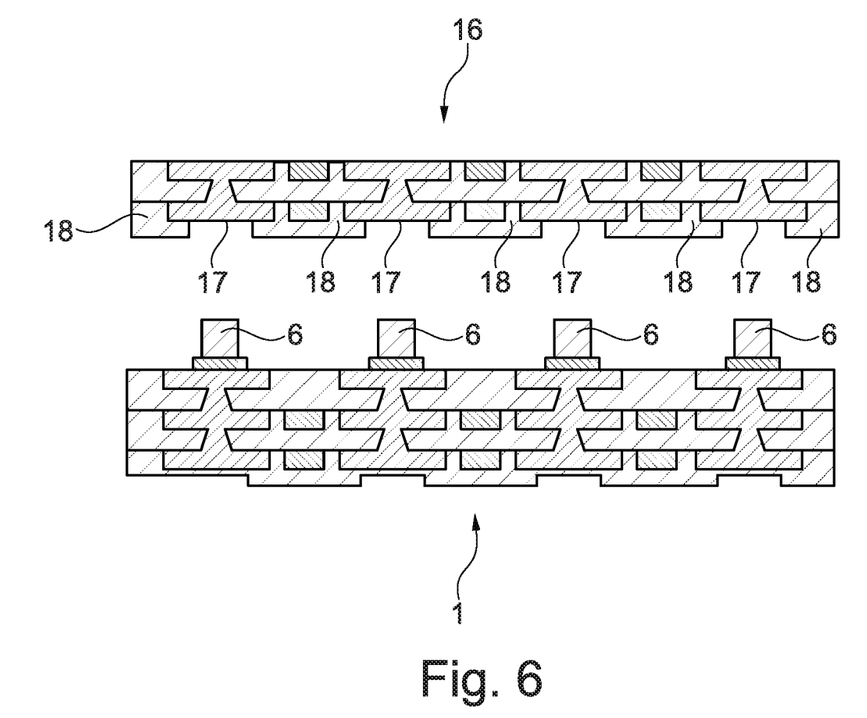
FIG. 6 illustrates an exemplary embodiment of an arrangement of two component carriers, wherein at least one of them is manufactured according to of the invention.

FIG. 6 illustrates an exemplary embodiment of an arrangement of two component carriers 1, 16, wherein at least the component carrier 1 is manufactured according to of the invention.

The pillars 6 of the component carrier 1 electrically contact another electrically conductive layer structure 17 of the other component carrier 16.

At least one of the component carrier 1 and the other component carrier 16 can be a printed circuit board (PCB), a substrate or an interposer. In this case the arrangement is a so-called board on board arrangement. Advantageously, a flip-chip connection is neither essential nor necessary.

At a side of the other component carrier 16 facing the component carrier 1, an electrically insulating layer structure 18 is formed, in which concavities are formed in correspondence to the other electrically conductive layer structures 17. Each one of the other electrically conductive layer structures 17 is exposed in a corresponding concavity of the other electrically insulating layer structure 18. Advantageously, a reliable and robust connection between both component carriers 1 and 16 can be achieved. Furthermore, it is not necessary to apply a solder resist on top of the component carrier 1.

The electrical (and optionally mechanical) connection between the other component carrier 16 and the component carrier 1 can be achieved by several options. A first option involves an application of an electrically conductive adhesive, an electrically conductive paste or a solder onto the pillars 6. A second option involves an application of an electrically conductive adhesive, an electrically conductive paste or a solder into the concavity of the electrically insulating layer structure 18 of the other component carrier 16. In a third option, an electrically conductive adhesive, an electrically conductive paste and a solder are not involved. Instead, the other component carrier 16 and the component carrier 1 are coupled by a direct copper-to-copper connection such as copper-copper direct bonding.

The connections may be established by using technologies like mass re-flow, copper-copper direct bonding, thermal compression bonding, soldering, any desired surface mount technology (such as direct chip attach, reflow soldering, use of an Anisotropic Conductive Film (ACF) or an Anisotropic Conductive Paste (ACP)) or other known connection technologies like ALIVH or $B^2iT$.

It should be noted that the term "comprising" does not exclude other elements or steps and the articles "a" or "an" do not exclude a plurality. Also, elements described in association with different embodiments may be combined.

The present invention is applicable to all coreless products having a pillar, such as a pillar made of copper. The present invention is applicable to ultra-thin boards for advanced packages.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
   a stack having an electrically conductive layer structure and an electrically insulating layer structure;
   the electrically conductive layer structure including a first plating structure; and
   a pillar with a seed layer portion on the first plating structure and a second plating structure on the seed layer portion; and
   a concave surface portion provided in the electrically insulating layer structure, wherein the concave surface portion comprises, in a cross-section of the component carrier, a top end at a main surface of the electrically insulating layer structure, a bottom end, and a curved surface therebetween,
   wherein the concave surface portion with the top end and the bottom end surrounds the pillar,
   wherein the first plating structure is arranged at least partially laterally inside of the electrically insulating layer structure,
   wherein the first plating structure comprises a continuous flat upper most surface being at the same level as the top end of the concave surface portion and forming part of an outer surface of the stack, and a lower most surface, wherein at least the lower most surface is situated in the electrically insulating layer structure.

2. The component carrier according to claim 1, wherein the seed layer portion is a foil portion; and the foil portion and the second plating structure of the pillar are made of copper.

3. The component carrier according to claim 1, wherein the component carrier is a coreless component carrier where the stack is not supported on a core.

4. The component carrier according to claim 1,
wherein the seed layer portion has an undercut with respect to the first plating structure and the second plating structure,
wherein the undercut p has a depth in a range between 0.3 µm and 5 µm.

5. The component carrier according to claim 1,
wherein a surface finish either covers only a top surface of the pillar or a top surface and sidewalls of the pillar,
wherein the surface finish comprises a single layer of silver, ENEPIG, ENIG, OSP, or a double layer of nickel/gold or nickel/silver.

6. The component carrier according to claim 1,
wherein the pillar is tapered from the seed layer portion to the second plating structure.

7. The component carrier according to claim 1,
wherein the stack is not provided with a solder resist on the side where the pillar is arranged.

8. The component carrier according to claim 1, further comprising:
a component, mounted on and/or embedded in the at least one electrically insulating layer structure and/or the at least one electrically conductive layer structure, wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

9. The component carrier according to claim 1,
wherein the at least one electrically conductive layer structure comprises at least one of the group consisting of copper, aluminum, nickel, silver, gold, palladium, and tungsten, and
wherein the at least one electrically insulating layer structure comprises at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

10. The component carrier according to claim 1,
wherein the component carrier is at least one of a plate, a printed circuit board, a substrate, and a laminate-type component carrier.

11. The component carrier according to claim 1,
wherein the foil portion has a thickness in a range of 2 to 3 µm.

12. A method of manufacturing a component carrier, the method comprising the following steps:
a) forming a stack including an electrically conductive layer structure and an electrically insulating layer structure; and
b) forming the electrically conductive layer structure to comprise a first plating structure and a pillar which comprises a seed layer portion on the first plating structure and a second plating structure on the seed layer portion, wherein-forming the stack includes providing a concave surface portion in the electrically insulating layer structure, wherein the concave surface portion comprises, in a cross-section of the component carrier, a top end at a main surface of the electrically insulating layer structure, a bottom end, and a curved surface therebetween,
wherein the concave surface portion with the top end and the bottom end surrounds the pillar,
wherein the first plating structure is arranged at least partially laterally inside of the electrically insulating layer structure,
wherein the first plating structure comprises a continuous flat upper most surface being at the same level as the top end of the concave surface portion and forming part of an outer surface of the stack, and a lower most surface, wherein at least the lower most surface is situated in the electrically insulating layer structure.

13. The method according to preceding claim 12,
wherein the step a) comprises the following substeps:
a1) providing a temporary core having a core base covered by a seed layer, which forms an outer surface of the temporary core;
a2) forming the stack onto the seed layer of the temporary core; and
a3) separating the stack including the first plating structure and the seed layer from the core base of the temporary core; and
the step b) comprises the following substeps:
b1) applying a resist onto the seed layer;
b2) removing parts of the resist, thereby forming a pattern;
b3) plating the pattern, thereby forming the second plating structure of the pillar in accordance to the pattern;
b4) removing the remaining resist;
b5) etching the seed layer to reduce a thickness of the seed layer at positions which are not covered by the pillar, thereby forming the seed layer portion; and
b6) providing a surface finish onto the pillar.

14. The method according to claim 13, wherein in step b5), an undercut is formed in the seed layer portion with respect to the first plating structure and the second plating structure.

15. The method according to claim 12,
wherein the foil and the second plating structure of the pillar are made of copper.

16. The method according to claim 12, further comprising:
a step of covering either only a top surface of the pillar or a top surface and sidewalls of the pillar by a surface finish, wherein the surface finish comprises a single layer, of silver, ENEPIG, ENIG, OSP, or a double layer, of nickel/gold or nickel/silver.

17. The method according to claim 12, wherein the pillar is formed to taper from the seed layer to the second plating structure.

18. The method according to claim 12,
wherein the foil portion has a thickness in a range of 2 to 3 µm.

* * * * *

UNITED STATES PATENT AND TRADEMARK OFFICE
CERTIFICATE OF CORRECTION

PATENT NO. : 11,553,599 B2
APPLICATION NO. : 16/713527
DATED : January 10, 2023
INVENTOR(S) : Yu-Hui Wu It is certified that error appears in the above-identified patent and that said Letters Patent is hereby corrected as shown below:

On the Title Page

In item (30) Foreign Application Priority Data:
Please delete "20181158190537" and replace with -- 201811581905.7 --.

Signed and Sealed this
Sixteenth Day of May, 2023

Katherine Kelly Vidal
*Director of the United States Patent and Trademark Office*